US008212368B2

(12) United States Patent
Kao et al.

(10) Patent No.: US 8,212,368 B2
(45) Date of Patent: *Jul. 3, 2012

(54) SEMICONDUCTOR PACKAGE AND MANUFACTURING METHOD THEREOF AND ENCAPSULATING METHOD THEREOF

(75) Inventors: Chung-Yao Kao, Kaohsiung (TW); Tsang-Hung Ou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/053,878

(22) Filed: Mar. 22, 2011

(65) Prior Publication Data

US 2011/0169156 A1 Jul. 14, 2011

Related U.S. Application Data

(63) Continuation of application No. 12/603,271, filed on Oct. 21, 2009, now Pat. No. 7,932,617.

(60) Provisional application No. 61/154,336, filed on Feb. 20, 2009.

(30) Foreign Application Priority Data

Jul. 1, 2009 (TW) .............................. 98122322 A

(51) Int. Cl.
H01L 23/28 (2006.01)
(52) U.S. Cl. ........................ 257/787; 438/127
(58) Field of Classification Search .................. 257/787, 257/778; 438/127, 126, 112, 124, 108
See application file for complete search history.

(56) References Cited

U.S. PATENT DOCUMENTS

| 6,750,080 | B2 * | 6/2004 | Masuda et al. ............... 438/106 |
| 6,921,967 | B2 * | 7/2005 | Tzu et al. ...................... 257/676 |
| 7,230,331 | B2 | 6/2007 | Chen et al. |
| 2003/0011078 | A1 * | 1/2003 | Fukao et al. .................. 257/787 |
| 2003/0183946 | A1 | 10/2003 | Fukuda et al. |
| 2006/0145362 | A1 | 7/2006 | Chang et al. |
| 2007/0200234 | A1 | 8/2007 | Gerber et al. |

FOREIGN PATENT DOCUMENTS

| CN | 1449031 A | 10/2003 |
| TW | 200625562 | 7/2006 |

OTHER PUBLICATIONS

Taiwan Office Action of Mar. 20, 2012.

* cited by examiner

*Primary Examiner* — Sheila V Clark
(74) *Attorney, Agent, or Firm* — Muncy, Geissler, Olds & Lowe, PLLC

(57) ABSTRACT

A semiconductor package, a manufacturing method thereof and an encapsulating method thereof are provided. The semiconductor package includes a substrate, a semiconductor chip, a plurality of conductive parts and a sealant. The conductive parts electrically connect an upper surface of the substrate and an active surface of the semiconductor chip. The sealant covers a back surface of the semiconductor chip, wherein the space between the upper surface of the substrate and the active surface of the semiconductor chip is filled with a portion of the sealant. The back surface of the semiconductor chip is spaced apart from a top surface of the sealant by a first distance, the upper surface of the substrate is spaced apart from the active surface of the semiconductor chip by a second distance, and the ratio of the first distance to the second distance is smaller than or equal to 5.

20 Claims, 5 Drawing Sheets

SEMICONDUCTOR PACKAGE AND MANUFACTURING METHOD THEREOF AND ENCAPSULATING METHOD THEREOF

This is a continuation application of application Ser. No. 12/603,271, filed Oct. 21, 2009 now U.S. Pat. No. 7,932,617 which claims the benefit of a provisional application Ser. No. 61/154,336, filed Feb. 20, 2009, and the benefit of Taiwan application Serial No. 98122322, filed Jul. 1, 2009. These related applications are incorporated herein by reference.

BACKGROUND

1. Technical Field

The disclosure relates in general to a semiconductor package and a manufacturing method thereof and an encapsulating method thereof, and more particularly to a semiconductor package having a semiconductor chip and a manufacturing method thereof and an encapsulating method thereof.

2. Description of the Related Art

There is a large variety of semiconductor packages such as flip chip ball grid array (FCBGA) and flip chip CSP (FCCSP) which utilizes sealant to encapsulate the chip with a sealant.

However, during the process of filling the cavity of an encapsulating mold with the sealant, the flowing speed of the sealant may slow down due to large resistance, and causes the sealant to fill the cavity in a non-uniform manner. Thus, after a semiconductor package is completed, there are a lot of loose and large-sized voids present inside the sealant.

SUMMARY

The disclosure is directed to a semiconductor package and a manufacturing method thereof. A first distance is defined between the chip and the sealant and a second distance is defined between the chip and the substrate. The ratio of the first distance to the second distance is a predetermined ratio, so that the flowing resistance of the sealant is reduced, the cavity is uniformly filled with the sealant, and the size of the voids inside the sealant is reduced.

According to a first aspect of the disclosure, a semiconductor package is provided. The semiconductor package includes a substrate, a semiconductor chip, a plurality of conductive parts and a sealant. The substrate has an upper surface. The semiconductor chip has an active surface and a back surface opposite to the active surface. The conductive parts electrically connect the upper surface of the substrate and the active surface of the semiconductor chip. The sealant covering the back surface of the semiconductor chip and having a top surface, wherein the space between the upper surface of the substrate and the active surface of the semiconductor chip is filled with a portion of the sealant. Wherein, the back surface of the semiconductor is spaced apart from the top surface of the sealant by a first distance, the upper surface of the substrate is spaced apart from the active surface of the semiconductor chip by a second distance, and the ratio of the first distance to the second distance is smaller than or equal to 5.

According to a second aspect of the disclosure, a manufacturing method of a semiconductor package is provided. The manufacturing method includes the following steps. A substrate having an upper surface is provided. A plurality of semiconductor chips is provided on the upper surface of the substrate, wherein each of the semiconductor chips has an active surface and a back surface opposite to the active surface. A plurality of first conductive parts is formed between the upper surface of the substrate and the active surface of each semiconductor chip. The semiconductor chips and the substrate are disposed in a cavity of an encapsulating mold, wherein the encapsulating mold further has a cavity inner-top surface opposite to the back surface of each semiconductor chip, the cavity inner-top surface is spaced apart from the back surface by a first distance, the upper surface of the substrate is spaced apart from the active surface of each semiconductor chip by a second distance, and the ratio of the first distance to the second distance is smaller than or equal to 5. The cavity is filled with a sealant to cover the semiconductor chips, wherein the space between the upper surface of the substrate and the active surface of each semiconductor chip is filled with a portion of the sealant.

According to a third aspect of the disclosure, an encapsulating method of a semiconductor package is provided. The encapsulating method includes the following steps. A substrate having an upper surface is provided. A plurality of semiconductor chips is provided on the upper surface of the substrate, wherein each of the semiconductor chips has an active surface and a back surface opposite to the active surface. A plurality of first conductive parts is formed between the upper surface of the substrate and the active surface of each semiconductor chip. The semiconductor chips and the substrate are disposed in a cavity of an encapsulating mold, wherein the encapsulating mold comprises a first flow-way, a second flow-way and a third flow-way, and has a cavity influx located on a first inner-wall of the cavity, a first mold influx and a second mold influx, one end of the first flow-way is connected to the first mold influx, one end of the second flow-way is connected to the second mold influx, one end of the third flow-way is connected to the cavity influx, the other end of the first flow-way, the other end of the second flow-way and the other end of the third flow-way are connected to a junction, and the cavity further comprises a second inner-wall opposite to the first inner-wall. The cavity is evacuated, so that the pressure of the cavity reduces to a vacuum pressure being smaller than −900 hpa. The cavity is filled with a sealant, wherein a portion of the sealant which enters the cavity via the first mold influx and the other portion of the sealant which enters the cavity via the second mold influx are merged at the junction and flow toward the cavity influx to enter the cavity to cover the semiconductor chips, and the space between the upper surface of the substrate and the active surface of each semiconductor chip is filled with a portion of the sealant; the step of filling the cavity with a sealant includes the following steps. The flowing speed of the sealant which enters the cavity is controlled, so that the required time for the sealant to fill up the cavity is within 15 seconds, and the flowing speed of the sealant is decreased when the sealant is near the second inner-wall of the cavity.

The disclosure will become apparent from the following detailed description of the preferred but non-limiting embodiments. The following description is made with reference to the accompanying drawings.

DETAILED DESCRIPTION

The disclosure is elaborated by a number of embodiments disclosed below. However, the disclosure and the accompanying drawings of the following embodiments are for elaboration only, not for limiting the scope of protection of the disclosure. Moreover, secondary elements are omitted in the following embodiments to highlight the technical features of the disclosure.

First Embodiment

Figure 1:
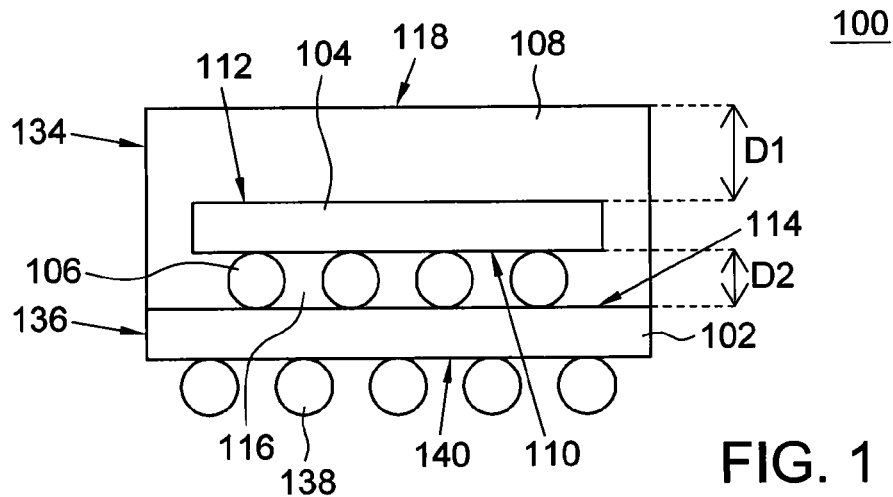
FIG. 1 shows a semiconductor package according to a first embodiment of the disclosure.

Referring to FIG. 1, a semiconductor package according to a first embodiment of the disclosure is shown. The semiconductor package 100 includes a substrate 102, a semiconductor chip 104, a plurality of first conductive parts 106, a sealant 108 and a plurality of second conductive parts 138.

The semiconductor chip 104 has an active surface 110 and a back surface 112 opposite to the active surface 110. The first conductive parts 106 electrically connect the upper surface 114 of the substrate 102 and the active surface 110 of the semiconductor chip 104. The sealant 108 covers the semiconductor chip 104, and the space between the upper surface 114 and the active surface 110 is filled with a portion of the sealant 116. The sealant 108 further has a top surface 118 and a lateral side 134, wherein the lateral side 134 is substantially aligned with a side surface 136 of the substrate 102.

The second conductive parts 138, disposed on a bottom surface 140 of the substrate 102, are electrically connected to the semiconductor chip 104 through the substrate 102.

Besides, the back surface 112 is spaced apart from the top surface 118 by a first distance D1, the upper surface 114 is spaced apart from the active surface 110 by a second distance D2, and the ratio of the first distance D1 to the second distance D2 ranges between 2-5. For example, when the upper surface 114 is spaced apart from the top surface 118 by a distance of 0.53 millimeters (mm), the first distance D1 may range between 100 μm-150 μm and the second distance D2 may range between 30 μm-50 μm.

The design of a predetermined ratio of the first distance D1 to the second distance D2 decreases the flowing resistance of the high-temperature liquid sealant during the encapsulating process, so that the cavity is uniformly filled with the sealant, and the size of the voids inside the sealant is reduced. Furthermore, if the ratio of the first distance D1 to the second distance D2 is too big, such as being greater than 5, then during the encapsulating process, the high-temperature liquid sealant (not illustrated in FIG. 1) will confront a greater resistance when flowing through the space between the active surface 110 and the upper surface 114 than when flowing through the space between the back surface 112 and the top surface 118. The greater resistance makes the flow of the high-temperature liquid sealant stagnated, so that the sealant may cool and solidify before the space between the active surface 110 and the upper surface 114 is completely filled with the high-temperature liquid sealant. As a result, a portion 116 of the solidified sealant 108 has non-uniform density and large-sized voids. To the contrary, in the present embodiment of the disclosure, the ratio of the first distance D1 to the second distance D2 is not greater than 5, hence effectively avoiding the above problems caused by large flowing resistance.

Figure 2:
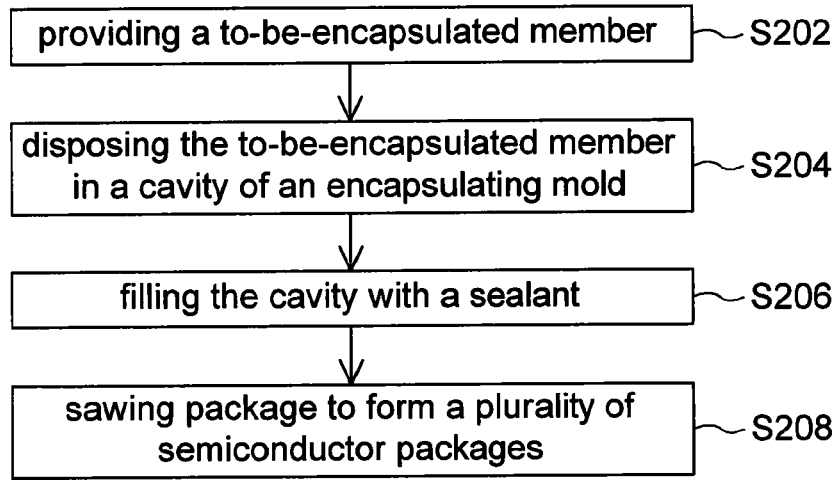
FIG. 2 shows a manufacturing method of a semiconductor package according to a second embodiment of the disclosure.

Referring to FIG. 2, a manufacturing method of a semiconductor package according to a second embodiment of the disclosure is shown. The manufacturing method of the semiconductor package 100 is elaborated below.

Figure 3A:
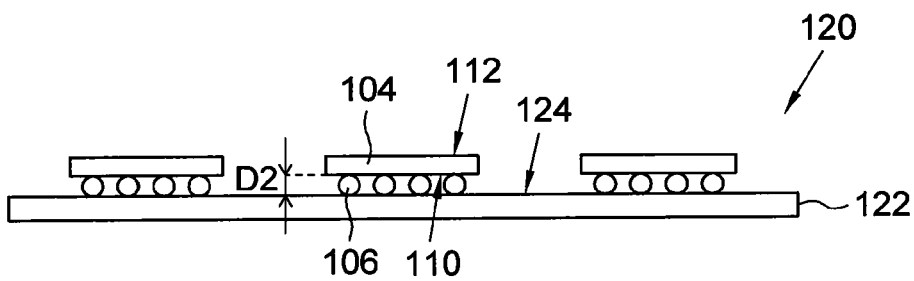
FIG. 3A shows a to-be-encapsulated member of FIG. 2.

Referring to FIG. 3A, a to-be-encapsulated member of FIG. 2 is shown. In step S202, a to-be-encapsulated member 120 is provided, wherein the to-be-encapsulated member 120 includes a substrate 122, a plurality of semiconductor chips 104 and a plurality of first conductive parts 106. Each semiconductor chip 104 has an active surface 110 and a back surface 112 opposite to the active surface 110. The first conductive parts 106 formed between the upper surface 124 of the substrate 122 and the active surface 110 electrically connect the substrate 122 and the semiconductor chip 104. The upper surface 124 is spaced apart from the active surface 110 by a second distance D2.

Furthermore, in step S202, the to-be-encapsulated member 120 can be implemented by several steps. That is, a substrate 122 and a semiconductor chip 104 are provided. Then, a plurality of first conductive parts 106 are formed between the upper surface 124 and the active surface 110 to complete the to-be-encapsulated member 120.

Figure 3B:
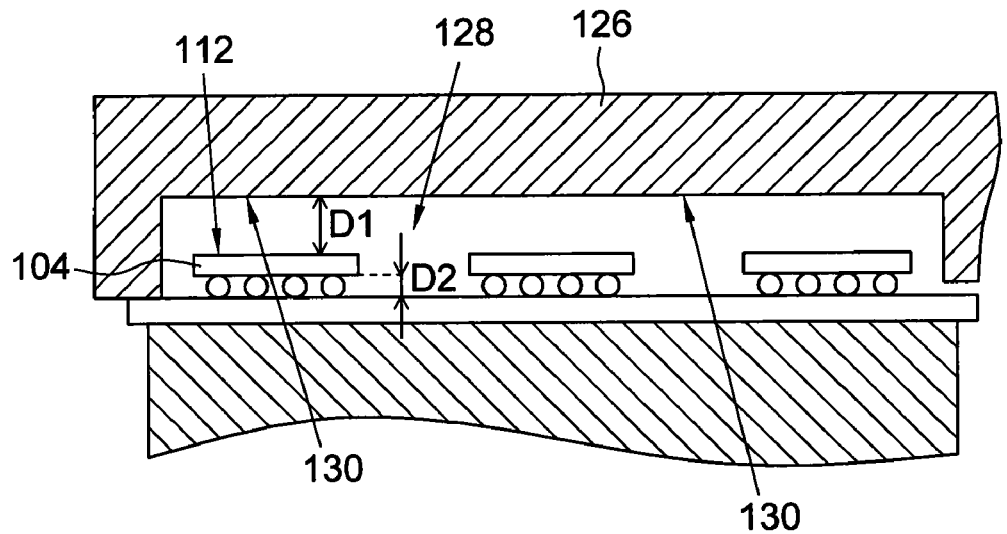
FIG. 3B shows a to-be-encapsulated member of FIG. 3A being disposed in the cavity.

Referring to FIG. 3B, a to-be-encapsulated member of FIG. 3A being disposed in the cavity is shown. In step S204, a to-be-encapsulated member 120 is disposed in a cavity 128 of an encapsulating mold 126. The encapsulating mold 126 further has a cavity inner-top surface 130 opposite to the back surface 112. The cavity inner-top surface 130 is spaced apart from the back surface 112 by a first distance D1, wherein the ratio of the first distance D1 to the second distance D2 ranges between 2-5.

If the ratio of the first distance D1 to the second distance D2 is not between 2-5, then an extra step (not illustrated) is added to step S202. In the extra step, the semiconductor chip 104 is grinded from the back surface 112 to reduce the thickness of the semiconductor chip 104 so that the ratio of the first distance D1 to the second distance D2 ranges between 2-5.

Figure 3C:
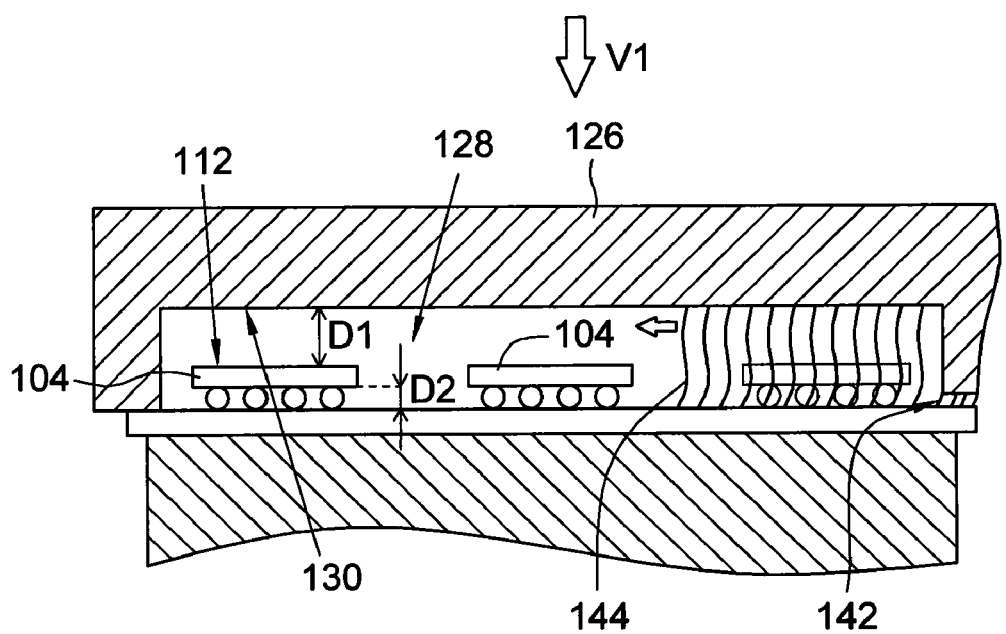
FIG. 3C shows a sealant being provided to the to-be-encapsulated member of FIG. 3B.
Figure 3D:
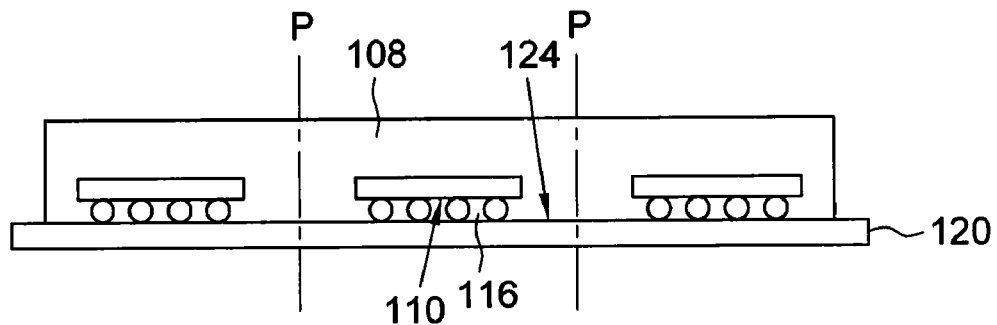
FIG. 3D shows a package of the present embodiment of the disclosure.

Referring to FIG. 3C, a sealant being provided to the to-be-encapsulated member of FIG. 3B is shown. In step S206, a high-temperature liquid sealant 144 is provided and enters the cavity 128 through the cavity influx 142 to cover the semiconductor chip 104. The solidified sealant 108 and the to-be-encapsulated member 120 form a package 132 as indicated in FIG. 3D. The high-temperature liquid sealant 144 flows towards the space between the upper surface 124 and the active surface 110, and solidifies to form a portion 116 of the sealant 108 of FIG. 1.

After step S206, the manufacturing method of the present embodiment of the disclosure may further include a step of forming a plurality of second conductive parts. For example, the second conductive parts 138 of FIG. 1 are formed on the bottom surface 140. The second conductive parts 138 are electrically connected to the semiconductor chip 104 through the substrate 102.

Moreover, after step S206, the manufacturing method of the present embodiment of the disclosure includes a singulating step. For example, as indicated in FIG. 3D, in step S208, a cutting tool, such as a saw blade (not illustrated), cuts through the package 132 of FIG. 3D along the cutting path P of FIG. 3D according to the position of the semiconductor chip 104 to form a plurality of semiconductor packages 100 of FIG. 1. Preferably but not limitedly, the cutting path P of FIG. 3D passes through the sealant 108 and the substrate 120, so that the singulated semiconductor package 100 has the lateral side 134 of the sealant 108 aligned with the side surface 136 of the substrate 120 as indicated in FIG. 1.

Second Embodiment

For the similarities between the second embodiment and the first embodiment, the same designations are used and the similarities are not repeated here. The second embodiment differs from the first embodiment in that the size of the voids inside the sealant 108 can be further reduced through the way of controlling manufacturing parameters in the manufacturing process of the encapsulating method in addition to the design of a predetermined ratio of the first distance D1 to the second distance D2 of the semiconductor package 100.

A first process control of the encapsulating method is disclosed below. Prior to step S206 of FIG. 2, as indicated in FIG. 3B, the air inside the cavity 128 is pumped out, so that the pressure of the cavity 128 reduces to a vacuum pressure, preferably smaller than −900 hpa, such as −950 hpa. Thus, the impurities in the cavity 128 are completely pumped out, and the air resistance inside the cavity 128 is reduced. Under such circumstances, in the subsequent encapsulating process, there will not be excessive impurities impeding the flow of the high-temperature liquid sealant 144 (illustrated in FIG. 3C), and after the high-temperature liquid sealant 144 solidifies, the solidified sealant 108 has smaller voids. Furthermore, as the air resistance inside the cavity 128 is reduced, the flow of the high-temperature liquid sealant 144 becomes smoother, reducing the size of the voids inside the solidified sealant.

A second process control of the encapsulating method is disclosed below. In step S206 of FIG. 2, the speed of the high-temperature liquid sealant 144 which enters the cavity 128 is controlled so that the required time for filling the cavity 128 with the high-temperature liquid sealant 144 is within a predetermined time, such as 15 seconds. This is because if the high-temperature liquid sealant 144 stays too long in the cavity 128, the high-temperature liquid sealant 144 may cool and solidify before the cavity 128 is completely filled with the high-temperature liquid sealant 144. As a result, the solidified sealant may have a non-uniform texture and large-sized voids. Thus, by controlling the molding time of the high-temperature liquid sealant 144 to be within a predetermined time, the present embodiment of the disclosure reduces the size of the voids inside the solidified sealant 108.

Figure 4:
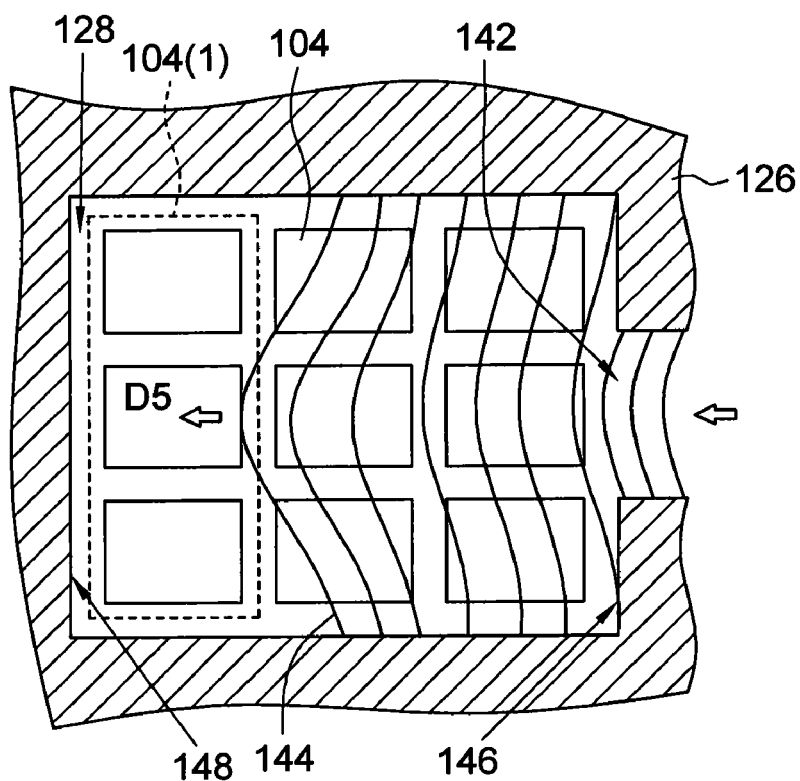
FIG. 4 shows the encapsulating mold and the to-be-encapsulated member of FIG. 3C viewed along the direction V1.

A third process control of the encapsulating method is disclosed below. Referring to FIG. 4, the encapsulating mold and the to-be-encapsulated member of FIG. 3C viewed along the direction V1 are shown. The encapsulating mold 126 further has a first inner-wall 146 and a second inner-wall 148 opposite to the first inner-wall 146. The cavity influx 142 is located on the first inner-wall 146. The high-temperature liquid sealant 144 enters the cavity via the cavity influx 142 and flows in the direction D5. When the high-temperature liquid sealant 144 is near the second inner-wall 148, the flowing speed of the high-temperature liquid sealant 144 is decreased, lest the high-temperature liquid sealant 144 may bounce back after hitting the inner-wall of the cavity 128 and influence the high-temperature liquid sealant that flows in the direction D5. If the high-temperature liquid sealant 144 hits the inner-wall of the cavity 128 and bounces back severely, the texture of the solidified sealant will become non-uniform. According to the present embodiment of the disclosure, the flowing speed of the high-temperature liquid sealant 144 is decreased to avoid the above problems, so that the solidified sealant has uniform texture.

Another implementation of third process control of the encapsulating method is disclosed below. Referring to FIG. 4, a plurality of semiconductor chips 104 are arranged as an array form. For example, the last row of the semiconductor chips, such as the semiconductor chips 104(1) are adjacent to the second inner-wall 148. When the high-temperature liquid sealant 144 touches the semiconductor chip 104(1), the flowing speed of the high-temperature liquid sealant 144 is decreased, hence avoiding the high-temperature liquid sealant 144 quickly bouncing back after hitting the inner-wall of the cavity 128.

Figure 5:
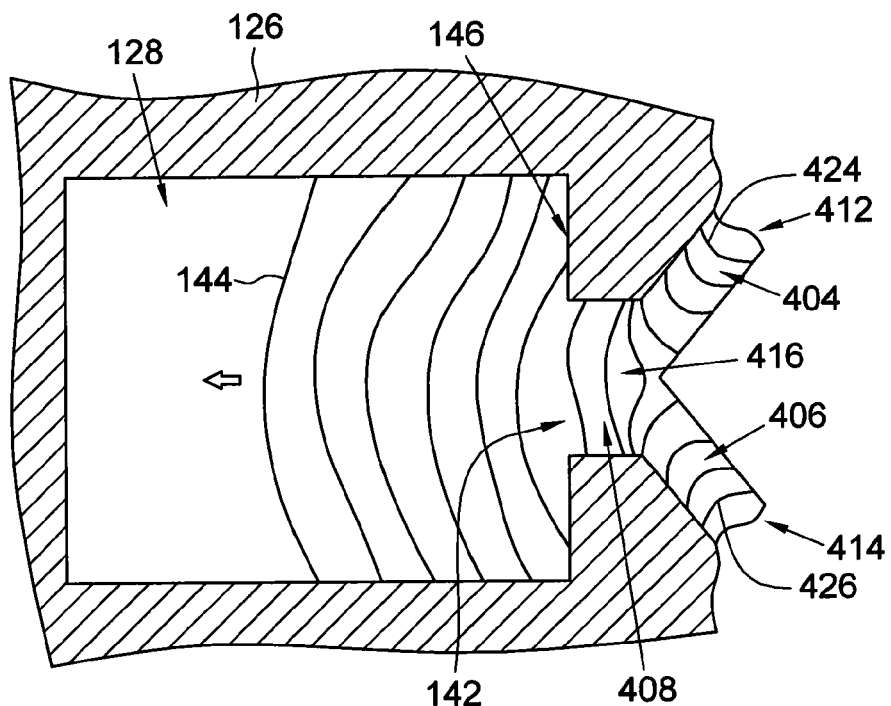
FIG. 5 shows an encapsulating mold according to a second embodiment of the disclosure.

Referring to FIG. 5, an encapsulating mold according to a second embodiment of the disclosure is shown. The encapsulating mold 126 includes a first flow-way 404, a second flow-way 406 and a third flow-way 408, and has a cavity influx 142, a first mold influx 412 and a second mold influx 414. One end of the first flow-way 404 connects the first mold influx 412, one end of the second flow-way 406 connects second mold influx 414, and one end of the third flow-way 408 connects the cavity influx 410, wherein the other end of the first flow-way 404, the other end of the second flow-way 406 and the other end of the third flow-way 408 are connected to a junction 416. The cavity influx 142 is located on the first inner-wall 146 of the cavity 128. Preferably but not limitedly, the cavity influx 142 is located at the middle of the first inner-wall 146.

During the encapsulating process, a portion 424 of the high-temperature liquid sealant 144 flows via the first mold influx 412 and the other portion 426 of the high-temperature liquid sealant 144 flows via the second mold influx 414. The two streams of high-temperature liquid sealant meet at the junction 416 to merge into one stream of sealant and then flow towards the cavity influx 142 to enter the cavity 128. As there is only one stream of high-temperature liquid sealant 144 entering the cavity 128, the interference problem caused by another stream of fluid will not occur. Therefore, the solidified sealant has a higher density and small-sized voids.

Figure 6:
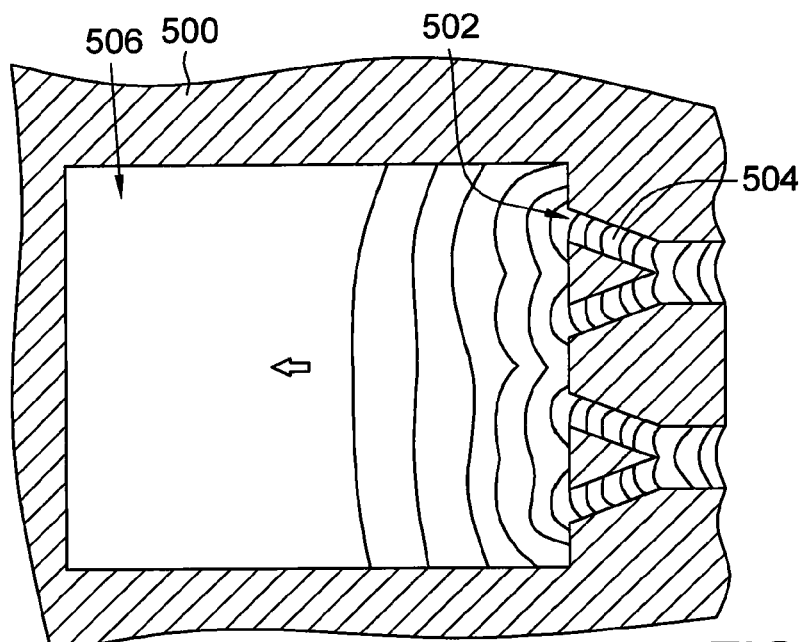
FIG. 6 shows an encapsulating mold having several cavity influxes.

Referring to FIG. 6, an encapsulating mold having several cavity influxes is shown. The encapsulating mold 500 has a cavity 506 and four cavity influxes 502. The encapsulating mold 500 has several cavity influxes 502. Thus, the several streams of high-temperature liquid sealant 504 which enter the cavity 506 from several cavity influxes 502 will interfere with each other, and the flowing and advancing of the several streams of high-temperature liquid sealant 504 are impeded. As a result, the solidified sealant has a non-uniform texture and the large-sized voids. According to the encapsulating mold 126 of the present embodiment of the disclosure, there is only one single stream of high-temperature liquid sealant entering the cavity 128, hence avoiding the mutual interference problem caused by the several streams of the high-temperature liquid sealant 504 in the cavity 506 of FIG. 6.

In the second embodiment, the back surface 112 and the top surface 118 are spaced apart by a first distance D1, the active surface 110 and the upper surface 114 are spaced apart by a second distance D2, and the ratio of the first distance D1 to the second distance D2 ranges between 2-5. Further accompanied by the above three ways of process control and the design of the flow-way of the encapsulating mold 126, the present embodiment of the disclosure reduces the flowing resistance of the high-temperature liquid sealant 144, so that the cavity 128 is uniformly and compactly filled with the high-temperature liquid sealant 144. Thus, the size of the voids inside the sealant 108 is reduced to be smaller than 10 mils.

Third Embodiment

Figure 7:
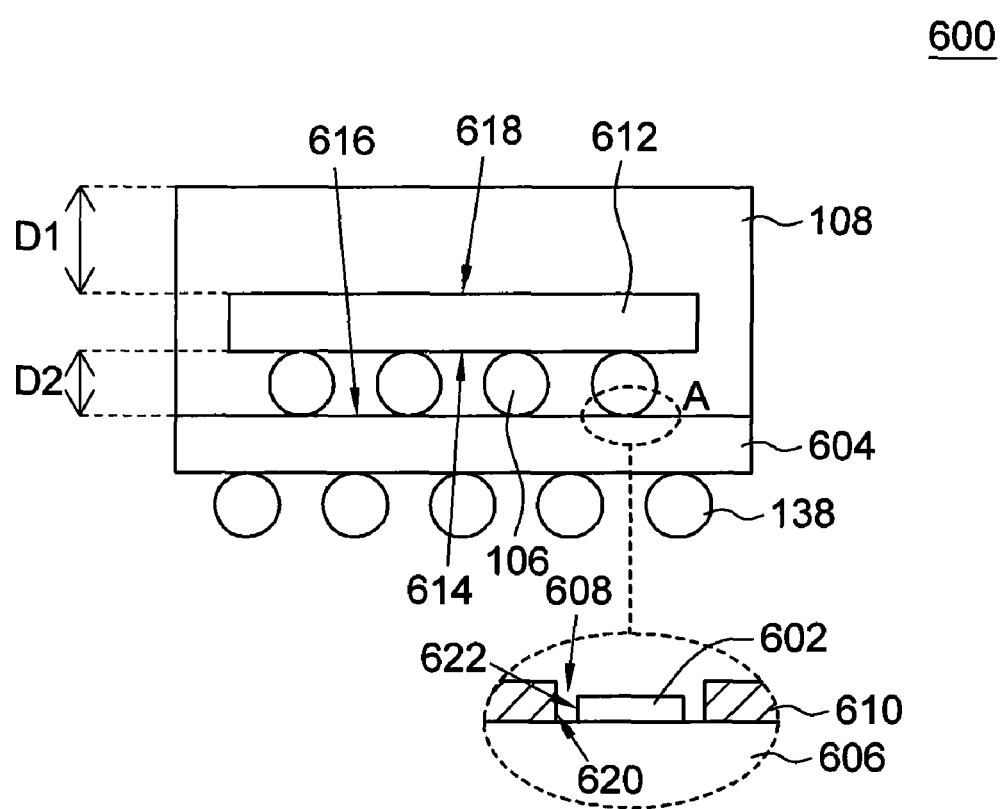
FIG. 7 shows a semiconductor package according to a third embodiment of the disclosure.

Referring to FIG. 7, a semiconductor package according to a third embodiment of the disclosure is shown. For the similarities between the third embodiment and the first embodiment, the same designations are used and the similarities are not repeated here. The third embodiment differs from the first embodiment in that the semiconductor package 600 of the third embodiment further includes non-solder mask defined (NSMD) pad 602, such as a copper-containing pad, in addition to the design that the ratio of the first distance D1 to the second distance D2 ranges between 2-5. The structure of the copper-containing pad is disclosed below.

As indicated in the partial enlargement A (not illustrated in the first conductive part 106) of FIG. 7, the substrate 604 of the semiconductor package 600 includes a substrate core 606, a plurality of pads 602, and an insulation layer 610 having a plurality of apertures 608. The active surface 614 of the semiconductor chip 612 of the semiconductor package 600 faces the insulation layer 610.

The pads 602 and the insulation layer 610 are disposed on the substrate core 606. The apertures 608 of the insulation layer 610 expose the corresponding pads 602. Furthermore, in an NSMD structure, there is a gap between the inner-lateral side 620 of the aperture 608 and the outer-lateral side 622 of the corresponding pad 602.

Compared with the solder mask defined (SMD) pad (not illustrated), the present embodiment of the disclosure does not require a pre-solder between the NSMD pad 602 and the first conductive parts 106. Therefore, in an NSMD structure, the distance between the active surface 614 and an upper surface 616 of the substrate 604 is smaller, so that the ratio of the first distance D1 to the second distance D2 increases. According to the spirit of the disclosure, as long as the ratio of the first distance D1 to the second distance D2 is within the range of 2-5, the size of the voids inside the solidified sealant still can be reduced. For example, like the technology disclosed in the first embodiment, by grinding the semiconductor chip 612 from the back surface 618 to reduce the thickness of the semiconductor chip 612, the ratio of the first distance D1 to the second distance D2 is controlled to be between 2-5.

The semiconductor package and the manufacturing method thereof and the encapsulating method thereof disclosed in the above embodiments of the disclosure have many features exemplified below:

(1). The back surface and the top surface are spaced apart by a first distance, the active surface and the upper surface of the substrate are spaced apart by a second distance, and that the ratio of the first distance to the second distance ranges between 2-5, hence the flowing resistance of the sealant is reduced so that the cavity is uniformly filled with the sealant and the size of the voids inside the sealant is reduced.

(2). Through the ratio design as disclosed in (1), the process control of the encapsulating method, such as the three ways of process control as disclosed in the second embodiment, and the design of the encapsulating mold of FIG. 5, the size of the voids inside the sealant is reduced.

(3). The embodiments of the disclosure are applicable to NSMD pads. The NSMD semiconductor package has a larger ratio of the first distance D1 to the second distance D2. According to the spirit of the disclosure, as long as the ratio of the first distance D1 to the second distance D2 is within the range of 2-5, the size of the voids inside the solidified sealant still can be reduced.

While the disclosure has been described by way of example and in terms of the embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package, comprising:
    a substrate having an upper surface;
    a semiconductor chip having an active surface and a back surface opposite to the active surface;
    a plurality of first conductive parts electrically connecting the upper surface of the substrate and the active surface of the semiconductor chip; and
    a sealant substantially covering the back surface of the semiconductor chip and having a top surface, wherein the space between the upper surface of the substrate and the active surface of the semiconductor chip is filled with a portion of the sealant;
    wherein, the back surface of the semiconductor is spaced apart from the top surface of the sealant by a first distance, the upper surface of the substrate is spaced apart from the active surface of the semiconductor chip by a second distance, and the ratio of the first distance to the second distance is smaller than or equal to 5.

2. The semiconductor package according to claim 1, wherein the ratio of the first distance to the second distance is greater than or equal to 2.

3. The semiconductor package according to claim 1, wherein the substrate has a bottom surface opposite to the upper surface, and the semiconductor package further comprises:
    a plurality of second conductive parts disposed on the bottom surface of the substrate, wherein the second conductive parts are electrically connected to the semiconductor chip through the substrate.

4. The semiconductor package according to claim 1, wherein the substrate further has a side surface, and the sealant has a lateral side;
    wherein, the lateral side of the sealant and the side surface of the substrate are substantially coplanar.

5. The semiconductor package according to claim 1, wherein the substrate comprises a substrate core, an insulation layer and a plurality of pads disposed on the substrate core, the insulation layer has a plurality of apertures, which expose the corresponding pads, so that the first conductive parts cover the corresponding pads.

6. The semiconductor package according to claim 5, wherein there is a gap between the inner-lateral side of each aperture and the outer-lateral side of the corresponding pad.

7. A manufacturing method of a semiconductor package, comprising:
    providing a substrate having an upper surface;
    providing a plurality of semiconductor chips on the upper surface of the substrate, wherein each of the semiconductor chips has an active surface and a back surface opposite to the active surface;
    forming a plurality of first conductive parts between the upper surface of the substrate and the active surface of each semiconductor chip;
    disposing the semiconductor chips and the substrate in a cavity of an encapsulating mold, wherein the encapsulating mold further has a cavity inner-top surface opposite to the back surface of each semiconductor chip, the cavity inner-top surface is spaced apart from the back surface by a first distance, the upper surface of the substrate is spaced apart from the active surface of each semiconductor chip by a second distance, and the ratio of the first distance to the second distance is smaller than or equal to 5;

filling the cavity with a sealant to cover the semiconductor chips, wherein the space between the upper surface of the substrate and the active surface of each semiconductor chip is filled with a portion of the sealant.

8. The manufacturing method according to claim 7, wherein the ratio of the first distance to the second distance is greater than or equal to 2.

9. The manufacturing method according to claim 7, further comprises:
grinding the semiconductor chips from the back surfaces to reduce the thickness of the semiconductor chips, so that the ratio of the first distance and the second distance ranges from 2 to 5.

10. The manufacturing method according to claim 7, further comprising:
evacuating the cavity, so that the pressure of the cavity reduces to a vacuum pressure.

11. The manufacturing method according to claim 10, wherein the vacuum pressure is smaller than −900 hpa.

12. The manufacturing method according to claim 7, wherein the step of filling the cavity with the sealant comprises:
controlling the speed of the sealant which enters the cavity, so that the required time for the cavity being filled with the sealant is within 15 seconds.

13. The manufacturing method according to claim 7, wherein the encapsulating mold further has a cavity influx located on a first inner-wall of the cavity, and the cavity is filled with the sealant which flows through the cavity influx, and the step of filling the cavity with the sealant comprises:
decreasing the flowing speed of the sealant when the sealant is near a second inner-wall of the cavity, wherein the second inner-wall and the first inner-wall are opposite to each other.

14. The manufacturing method according to claim 7, wherein the encapsulating mold comprises a first flow-way, a second flow-way and a third flow-way, and has a cavity influx located on an inner-wall of the cavity, a first mold influx and a second mold influx, one end of the first flow-way is connected to the first mold influx, one end of the second flow-way is connected to the second mold influx, one end of the third flow-way is connected to the cavity influx, and the other end of the first flow-way, the other end of the second flow-way and the other end of the third flow-way are connected to a junction;
wherein, a portion of the sealant which enters the cavity via the first mold influx and the other portion of the sealant which enters the cavity via the second mold influx are merged at the junction and flow toward the cavity influx to enter the cavity.

15. The manufacturing method according to claim 7, wherein the substrate comprising a substrate core, an insulation layer and a plurality of pads disposed on the substrate core, and the insulation layer has a plurality of apertures, which expose the corresponding pads, so that the first conductive parts cover the corresponding pads.

16. The manufacturing method according to claim 7, further comprising:
singulating the package to form a plurality of the semiconductor package according to the position of the semiconductor chips.

17. The manufacturing method according to claim 16, wherein the step of singulating the package comprises:
singulating the package along a cutting path, which passes through the sealant and the substrate, so that a lateral side of the sealant of the singulated semiconductor package is aligned with a side surface of the substrate.

18. The manufacturing method according to claim 7, wherein the sealant further has a top surface opposite to the back surface, the upper surface of the substrate is spaced apart from the top surface of the sealant by a distance of 0.53 mm, wherein the first distance ranges from 100 μm to 150 μm and the second distance ranges from 30 μm to 50 μm.

19. The manufacturing method according to claim 7, wherein the substrate further has a bottom surface, the manufacturing method further comprises:
forming a plurality of second conductive parts on the bottom surface of the substrate, wherein the second conductive parts are electrically connected to the semiconductor chip through the substrate.

20. An encapsulating method of a semiconductor package, comprising:
providing a substrate having an upper surface;
providing a plurality of semiconductor chips on the upper surface of the substrate, wherein each of the semiconductor chips has an active surface and a back surface opposite to the active surface;
forming a plurality of first conductive parts between the upper surface of the substrate and the active surface of each semiconductor chip;
disposing the semiconductor chips and the substrate in a cavity of an encapsulating mold, wherein the encapsulating mold comprises a first flow-way, a second flow-way and a third flow-way, and has a cavity influx located on a first inner-wall of the cavity, a first mold influx and a second mold influx, one end of the first flow-way is connected to the first mold influx, one end of the second flow-way is connected to the second mold influx, one end of the third flow-way is connected to the cavity influx, the other end of the first flow-way, the other end of the second flow-way and the other end of the third flow-way are connected to a junction, and the cavity further comprises a second inner-wall opposite to the first inner-wall;
evacuating the cavity, so that the pressure of the cavity reduces to a vacuum pressure being smaller than −900 hpa; and
filling the cavity with a sealant, wherein a portion of the sealant which enters the cavity via the first mold influx and the other portion of the sealant which enters the cavity via the second mold influx are merged at the junction and flow toward the cavity influx to enter the cavity to cover the semiconductor chips, and the space between the upper surface of the substrate and the active surface of each semiconductor chip is filled with a portion of the sealant; the step of filling the cavity with a sealant includes:
controlling the flowing speed of the sealant which enters the cavity, so that the required time for the sealant to fill up the cavity is within 15 seconds; and
decreasing the flowing speed of the sealant when the sealant is near the second inner-wall of the cavity.

* * * * *